(12) United States Patent
Chou

(10) Patent No.: US 7,474,128 B2
(45) Date of Patent: Jan. 6, 2009

(54) TRANSIENT VOLTAGE DETECTING CIRCUIT FOR ELECTRONIC SYSTEM HAVING MULTIPLE OF POWER SUPPLIES

(75) Inventor: Kuo-Yu Chou, HsinChu (TW)

(73) Assignee: Novatek Microelectronic Co., HsinChu (TW)

( * ) Notice: Subject to any disclaimer, the term of this patent is extended or adjusted under 35 U.S.C. 154(b) by 0 days.

(21) Appl. No.: 11/036,139

(22) Filed: Jan. 18, 2005

(65) Prior Publication Data

US 2006/0033547 A1    Feb. 16, 2006

(30) Foreign Application Priority Data

Aug. 13, 2004    (TW) .............................. 93124299 A

(51) Int. Cl.
*G01R 19/00*    (2006.01)
(52) U.S. Cl. .............................. 327/58; 327/78; 324/771
(58) Field of Classification Search .................. 327/58, 327/78, 79; 324/771
See application file for complete search history.

(56) References Cited

U.S. PATENT DOCUMENTS

| 5,084,873 | A | * | 1/1992 | Houston | ...................... 714/48 |
| 5,361,033 | A | * | 11/1994 | Houston | ..................... 324/537 |
| 5,477,151 | A | * | 12/1995 | Houston | ..................... 324/537 |
| 5,999,392 | A |   | 12/1999 | Sung et al. |  |
| 6,590,412 | B2 | * | 7/2003 | Sunter | ......................... 324/771 |

\* cited by examiner

*Primary Examiner*—Kenneth B. Wells
(74) *Attorney, Agent, or Firm*—Hoffman Warrick, LLC

(57) ABSTRACT

The invention provides a transient voltage detecting circuit for detecting changes of voltage in an electronic system which has a first power supply (VDD), a second power supply (VDD), a third power supply (VDD), a fourth power supply (VDD), a first ground (GND), and a second ground (GND). The voltage of the first VDD is substantially equal to that of the second VDD. The voltage of the third VDD is substantially equal to that of the fourth VDD. The voltage of the first GND is substantially equal to that of the second GND. The circuit according to the invention can detect a positive or negative transient voltage once that occurs at the first VDD, the second VDD, the third VDD, or the fourth VDD.

6 Claims, 2 Drawing Sheets

TRANSIENT VOLTAGE DETECTING CIRCUIT FOR ELECTRONIC SYSTEM HAVING MULTIPLE OF POWER SUPPLIES

BACKGROUND OF THE INVENTION

1. Field of the Invention

A present invention relates to a transient voltage detecting circuit for an electronic system having a plurality of power supplies. The circuit, according to the present invention, can detect a positive or negative transient voltage once that occurs at each power supply.

2. Description of the Prior Art

Typical electronic systems, particularly integrated circuits, have self-protecting precautions against surge, glitch, overvoltage, and other undesirable transient voltages, so as to protect the systems from wrong operations, crash, or damage of components owing to the above-mentioned transient voltages.

The self-protecting precautions adopted by the electronic systems in accordance with transient voltages focus on detecting transient voltages rapidly and accurately. Please refer to the U.S. Pat. No. 5,999,392 for the prior art of detecting transient voltage. U.S. Pat. No. 5,999,392 disclosed an auto resetting circuit with a function of detecting transient voltages; it is used for detecting unusual changes in voltages between the power supplies and the grounds in electronic systems in order to reset in time.

Nowadays, electronic systems are more complex in design, and they also comprise a plurality of power supplies for supporting different voltages for each component of the electronic systems. However, prior arts of detecting transient voltage aimed at only one power supply, or one ground, or transient voltages occurring between one power supply and one ground. A circuit for detecting transient voltages at a plurality of power supplies is still lacked up to now.

Therefore, a major objective of the present invention is to provide a transient voltage detecting circuit for detecting a plurality of power supplies of an electronic system according to the present invention.

Besides, the prior arts about transient voltage detection mostly employ components relating to or referring to the power supply of the electronic system, such as NAND gate, NOR gate, NOT gate, etc. As soon as a transient voltage occurs, the components relating to or referring to the power supply of the electronic system may not be able to remain their original electric characteristics. Therefore, the accuracy of a transient voltage detected by the transient voltage detecting circuit with the components relating to or referring to the power supply of the electronic system is not reliable.

Consequently, another objective of the present invention is to provide a transient voltage detecting circuit for detecting changes of power supplies, without having to maintain a stable main power according to the components of the transient voltage detecting circuit.

SUMMARY OF THE INVENTION

A main objective of the present invention is to provide a transient voltage detecting circuit for detecting changes in an electronic system, particularly an electronic system with a plurality of power supplies. The transient voltage detecting circuit according to the present invention can detect a positive or negative transient voltage as soon as a transient voltage occurs at each power supply.

Another objective of the present invention is to provide a transient voltage detecting circuit, for monitoring a plurality of power supplies simultaneously. Moreover, according to the components of the transient voltage detecting circuit the present invention, none of them needs to cite or reference the power supplies being monitored; therefore, once a transient voltage occurs, components of the circuit can retain their original electric properties to detect the transient voltage quickly and precisely.

A transient voltage detecting circuit of a preferred embodiment, according to the present invention, aims at detecting changes in an electronic system. Particularly, the electronic system comprises a first power supply, a second power supply, a third power supply, a fourth power supply, a first ground, and a second ground. The transient voltage detecting circuit comprises a first device, a second device, and a resetting device. The first device comprises a first first-type MOS transistor, coupled to the first power supply, and a first second-type MOS transistor, coupled between the first first-type MOS transistor and the first ground and also coupled via a gate thereof to the third power supply. The first device also provides a first output terminal between the first first-type MOS transistor and the first second-type MOS transistor. The second device comprises a second first-type MOS transistor, coupled to the second power supply and coupled via a gate thereof to the first output terminal, a third first-type MOS transistor, coupled in parallel with the second first-type MOS transistor, and a second second-type MOS transistor, coupled between the second first-type MOS transistor and the second ground and coupled via a gate thereof to the fourth power supply. The first first-type MOS transistor is coupled via a gate thereof to a first node formed between the second first-type MOS transistor and the second second-type MOS transistor. The resetting device comprises an output of a gate coupled to the third first-type MOS transistor, for outputting a reset output signal to turn on the third first-type MOS transistor to reset the transient voltage detecting circuit such that the voltage at the first node is at a first logic state and the voltages at the first output terminal is latched at a second logic state. Once a negative transient voltage occurs at the third power supply, the voltage at the first output terminal changes to the first logic state so that the voltage at the first node changes to the second logic state. Once a positive transient voltage occurs at the fourth power supply, the voltage at the first node changes to the second logic state so that the voltage at the first output terminal changes to the first logic state. Once the positive transient voltage occurs at the first power supply, the first first-type MOS transistor is turned on, so that the first output terminal changes to the first logic state. Once the negative transient voltage occurs at the second power supply, the first first-type MOS transistor is turned on, so that the first output terminal changes to the first logic state.

A transient voltage detecting circuit of a preferred embodiment, according to the present invention, further comprises a third device and a fourth device. The third device comprises a fourth first-type MOS transistor, coupled to the first power supply, a fifth first-type MOS transistor, coupled in parallel with the fourth first-type MOS transistor, and a third second-type MOS transistor, coupled between the fourth first-type MOS transistor and the first ground and also coupled via a gate thereof to the third power supply. The fourth device comprises a sixth first-type MOS transistor, coupled to the second power supply and also coupled via a gate thereof to the second node formed between the fourth first-type MOS transistor and the third second-type MOS transistor, and a fourth second-type MOS transistor, coupled between the sixth first-type MOS transistor and the second ground and also coupled via a gate thereof to the fourth power supply. The fourth device also provides a second output terminal between the sixth first-type MOS transistor and the fourth second-type MOS transistor. The sixth first-type is coupled via a gate thereof to the second output terminal. The resetting device is also via the output thereof coupled to a gate of the fourth first-type MOS transistor, and it outputs the reset signal to turn on the fourth first-type MOS transistor such that the voltage at the second node is at the first logic state, and the voltage at the second output terminal is latched at the second logic state. Once the positive transient voltage occurs at the third power supply, the voltage at the second node changes to the second logic state, so that the voltage at the second output terminal changes to the first logic state. Once the negative transient voltage occurs at the fourth power supply, the voltage at the second output terminal changes to the first logic state, so that the voltage at the second node also changes to the second logic state. Once the negative transient voltage occurs at the first power supply, the sixth first-type MOS transistor is turned on, so that the voltage at the second output terminal changes to the first logic state. Once the positive transient voltage occurs at the second power supply, the sixth first-type MOS transistor is turned on so that the voltage at the second output terminal changes to the first logic state.

The advantage and spirit of the present invention may be understood by the following recitations together with the appended drawings.

BRIEF DESCRIPTION OF THE APPENDED DRAWINGS

DETAILED DESCRIPTION OF THE INVENTION

The present invention provides a transient voltage detecting circuit for detecting positive transient voltage or negative voltage occurring at the power supplies of an electronic system or an integrated circuit, with a plurality of power supplies. With the example and explanations below, the features and spirits of the present invention will be clearly described.

Figure 1:
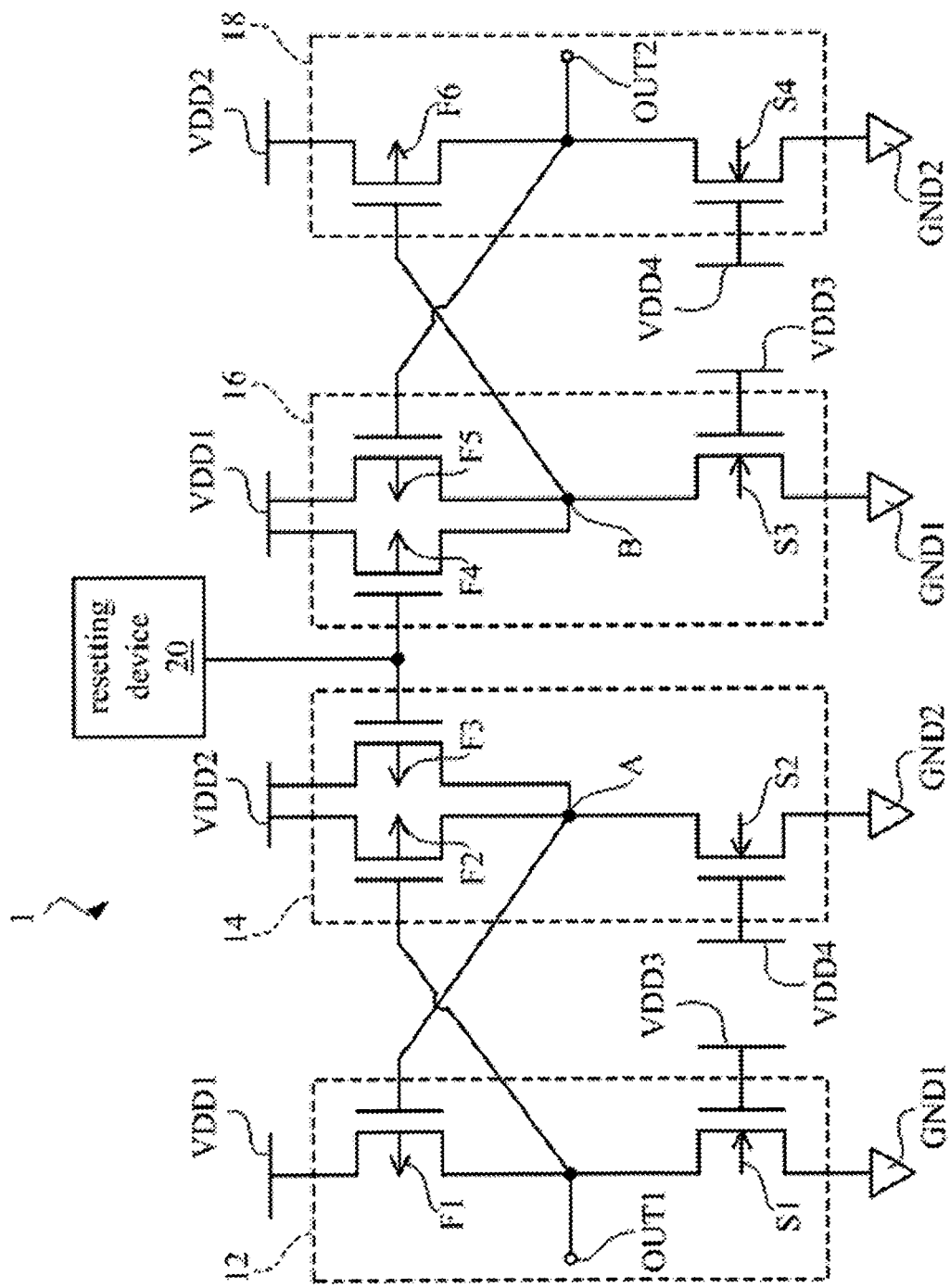
FIG. 1 is a schematic diagram showing a transient voltage detecting circuit of an embodiment according to the present invention.

Referring to FIG. 1, FIG. 1 is a diagram showing the fundamental structure of a transient voltage detecting circuit 1 according to an embodiment of the present invention. The transient voltage detecting circuit 1 detects changes in voltage for an electronic system (not shown in the diagram). Particularly, the electronic system comprises a first power supply (VDD1), a second power supply (VDD2), a third power supply (VDD3), a fourth power supply (VDD4), a first ground (GND1), and a second ground (GND2).

When the electronic system operates normally, the voltage of the first power supply (VDD1) substantially equals to the voltage of the second power supply (VDD2); for example, the above-mentioned voltage is 3.3 Volt. The voltage of the third power supply (VDD3) substantially equals to the voltage of the fourth power supply; for example, the above-mentioned voltage is 1.8 Volt. Moreover, the voltage of the first ground (GND1) substantially equals to voltage of the second ground (GND2). Therefore, the power supplies of the electronic system are symmetrically laid out.

As shown in FIG. 1, the transient voltage detecting circuit comprises a first device 12, a second device 14, and a resetting device 20.

The first device 12 comprises a first first-type MOS (Metal-oxide semiconductor) transistor F1, coupled to the first power supply VDD1, and a first second-type MOS transistor S1, coupled between the first first-type MOS transistor F1 and the first ground GND1 and also coupled via a gate thereof to the third power supply VDD3. The first device 12 also provides a first output terminal OUT1 between the first first-type MOS transistor F1 and the first second-type MOS transistor S1.

The second device 14 comprises a second first-type MOS transistor F2, coupled to the second power supply VDD2 and also coupled via a gate thereof to the first output terminal OUT1, a third first-type MOS transistor F3, coupled in parallel with the second first-type MOS transistor F2, and a second second-type MOS transistor S2, coupled between the second first-type MOS transistor F2 and the second ground GND2 and also coupled via a gate thereof to the fourth power supply VDD4. As shown in FIG. 1, the first first-type MOS transistor F1 is coupled via a gate thereof to a first node A, which is formed between the second first-type MOS transistor F2 and the second second-type MOS transistor S2.

As shown in FIG. 1, the resetting device 20 comprises an output coupled to a gate of the third first-type MOS transistor F3. The resetting device 20 is used for outputting a reset output signal to turn on the third first-type MOS transistor F3, so as to reset the transient voltage detecting circuit 1 such that the voltage at the first node A is at a first logic state and the voltage at the first output terminal OUT1 is latched at a second logic state.

In an embodiment, as shown in FIG. 1, the first-type MOS transistors (F1, F2, and F3) are P-type MOS transistors, and the second-type transistors (S1 and S2) are N-type MOS transistors. At this time, the reset signal being outputted by the resetting device 20 is a Pull-down signal. The first logic state is Logic HIGH, and the second logic state is Logic LOW.

The Pull-down signal outputted by the resetting device 20 turns on the third P-type MOS transistor F3 to reset the transient voltage detecting circuit 1 on the prerequisite that the first-type MOS transistors (F1, F2, and F3) are P-type MOS transistors, the second-type MOS transistors (S1 and S2) are N-type MOS transistors, and the reset signal is a Pull-down signal. At this time, the voltage at the first node A is at high logic state and the MOS transistors (F1, F2, S1, and S2) form a latched circuit such that the voltage of the first output terminal OUT1 is at low logic state. To change the state of the voltage at the first output terminal OUT1, the voltage of the third power supply VDD3 must be apparently lower than the voltage of the fourth power supply VDD4, or the voltage of the fourth power supply VDD4 must be apparently higher than the voltage of the third power supply VDD3, or the voltage of the first power supply VDD1 must be apparently higher than the voltage of the second power supply VDD2, or the voltage of the second power supply VDD2 must be apparently lower than the voltage of the first power supply VDD1.

Once a negative transient voltage occurs at the third power supply VDD3, the first N-type MOS transistor S1 will be cut off; the voltage at the first output terminal OUT1 changes to the high logic state, and the voltage at the first node A changes to the low logic state. Right after that, even after the voltage of the third power supply VDD3 recovers to the regular potential, the voltage at the first output terminal OUT1 will not be able to restore to the low logic state. In this way, the transient voltage detecting circuit 1 keeps a record of any unusual voltage (negative transient voltage) that occurs at the third power supply VDD3.

Once a positive transient voltage occurs at the fourth power supply VDD4, the voltage at the first node A changes to the low logic state so that the voltage at the first output terminal OUT1 changes to the high logic state. Right after that, even after the voltage of the fourth power supply VDD4 recovers to the regular potential, the voltage at the first output terminal OUT1 will not be able to restore to the low logic state. In this way, the transient voltage detecting circuit 1 keeps a record of any unusual voltage (positive transient voltage) that occurs at the fourth power supply VDD4.

Once the positive transient voltage occurs at the first power supply VDD1, the first P-type MOS transistor F1 is turned on so that the second output terminal OUT2 changes to the high logic state. Right after that, even after the voltage of the first power supply VDD1 recovers to the regular potential, the voltage at the second output terminal OUT2 will not be able to restore to the low logic state. In this way, the transient voltage detecting circuit 1 keeps a record of an unusual voltage (negative transient voltage) that occurs at the first power supply VDD1.

Once the negative transient voltage occurs at the second power supply VDD2, the second P-type MOS transistor F2 is cut off, the first node A changes to the low logic state, and the first P-type MOS transistor F1 is turned on so that the voltage at the second output terminal OUT2 changes to the high logic state. At this time, even after the voltage of the second power supply VDD2 recovers to the regular potential, the voltage at the second output terminal OUT2 will not be able to restore to the low logic state. In this way, the transient voltage detecting circuit 1 keeps a record of any unusual voltage (negative transient voltage) that occurs at the second power supply VDD2.

Referring to FIG. 1, the transient voltage detecting circuit 1 further comprises a third device 16 and a fourth device 18 for detecting the positive transient voltage occurring at the third power supply VDD3, the negative transient voltage occurring at the fourth power supply VDD4, the negative transient voltage occurring at the first power supply VDD1, and the positive transient voltage occurring at the second power supply VDD2 according to the present invention.

The third device 16 comprises a fourth first-type MOS transistor F4, coupled to the first power supply VDD1, a fifth first-type MOS transistor F5, coupled in parallel with the fourth first-type MOS transistor F4, and a third second-type MOS transistor S3, coupled between the fourth first-type MOS transistor F4 and the first ground GND1 and also coupled via a gate thereof to the third power supply VDD3.

The fourth device 18 comprises a sixth first-type MOS transistor F6, coupled to the second power supply VDD2 and also coupled via a gate thereof to a second node B formed between the fourth first-type MOS transistor F4 and the third second-type MOS transistor S3; the fourth device also comprises a fourth second-type MOS transistor S4, coupled between the sixth first-type MOS transistor F6 and the second ground GND2 and also coupled via a gate thereof to the fourth power supply VDD4. Furthermore, the fourth device 18 also provides a second output terminal OUT2 between the sixth first-type MOS transistor F6 and the fourth second-type MOS transistor S4.

The resetting device 20 comprises an output coupled to a gate of the fourth first-type MOS transistor F4, for outputting a reset signal to turn on the fourth first-type MOS transistor F4 such that the voltage at the second node B is at the first logic state and the voltage at the second output terminal OUT2 is latched at the second logic state.

In an embodiment, as shown in FIG. 1, the first-type MOS transistors (F4, F5, and F6) are P-type MOS transistors, and the second-type transistors (S3 and S4) are N-type MOS transistors. At this time, the reset signal being outputted by the resetting device 20 is a Pull-down signal. The first logic state is Logic HIGH, and the second logic state is Logic LOW.

The Pull-down signal outputted by the resetting device 20 turns on the fourth P-type MOS transistor F4 to reset the transient voltage detecting circuit I on the prerequisite that the first-type MOS transistors (F4, F5, and F6) are P-type MOS transistors, the second-type MOS transistors (S3 and S4) are N-type MOS transistors, and the reset signal is a Pull-down signal. At this time, the voltage at the second node B is at the high logic state, and the MOS transistors (F5, F6, S3, and S4) form a latched circuit such that the voltage of the second output terminal OUT2 is at low logic state. To change the state of voltage at the second output terminal OUT2, the voltage of the third power supply VDD3 must be apparently higher than the voltage of the fourth power supply VDD4, or the voltage of the fourth power supply VDD4 must be apparently lower than the voltage of the third power supply VDD3, or the voltage of the first power supply VDD1 must be apparently lower than the voltage of the second power supply VDD2, or the voltage of the second power supply VDD2 must be apparently higher than the voltage of the first power supply VDD1.

Once a positive transient voltage occurs at the third power supply VDD3, the third N-type MOS transistor S3 forces the second node B to change to the low logic state and then to further change the voltage at the second output terminal OUT2 to the high logic state (at this time, the state of the first node A and the state of the first output terminal are the same). Right after that, even after the voltage of the third power supply VDD3 recovers to the regular potential, the voltage at the second output terminal OUT2 will not be able to restore to the low logic state. In this way, the transient voltage detecting circuit 1 keeps a record of any unusual voltage (positive transient voltage) that occurs at the third power supply VDD3.

Once a negative transient voltage occurs at the fourth power supply VDD4, the voltage at the second output terminal OUT2 changes to the high logic state, so that the voltage at the second node B changes to the low logic state. At this time, even after the voltage of the fourth power supply VDD4 recovers to the regular potential, the voltage at the second output terminal OUT2 will not be able to restore to the low logic state. In this way, the transient voltage detecting circuit 1 keeps a record of any unusual voltage (negative transient voltage) that occurs at the fourth power supply VDD4.

Once the negative transient voltage occurs at the first power supply VDD1, the fifth P-type MOS transistor F5 is cut off, so that the second node B changes to the low logic state; furthermore, the sixth P-type MOS F6 transistor is turned on, and the voltage of the second output terminal OUT2 changes to the high logic state. Right after that, even after the voltage of the first power supply VDD1 recovers to the regular potential, the voltage at the second output terminal OUT2 will not be able to restore to the low logic state. In this way, the transient voltage detecting circuit 1 keeps a record of any unusual voltage (negative transient voltage) that occurs at the first power supply VDD1.

Once the positive transient voltage occurs at the second power supply VDD2, the sixth P-type MOS transistor F6 is turned on, such that the voltage of the second output terminal OUT2 changes to the high logic state; furthermore, the fifth P-type MOS transistor F5 is cut off, and the second node B changes to the low logic state. Right after that, even after the voltage of the second power supply VDD2 recovers to the regular potential, the voltage at the second output terminal OUT2 will not restore to the low logic state. In this way, the transient voltage detecting circuit 1 keeps a record of any unusual voltage (positive transient voltage) that occurs at the second power supply VDD2.

Something deserve to be mentioned is that because of the symmetric design of the transient voltage detecting circuit 1, it can detect unusual changes of voltage, whether it is positive or negative.

Figure 2:
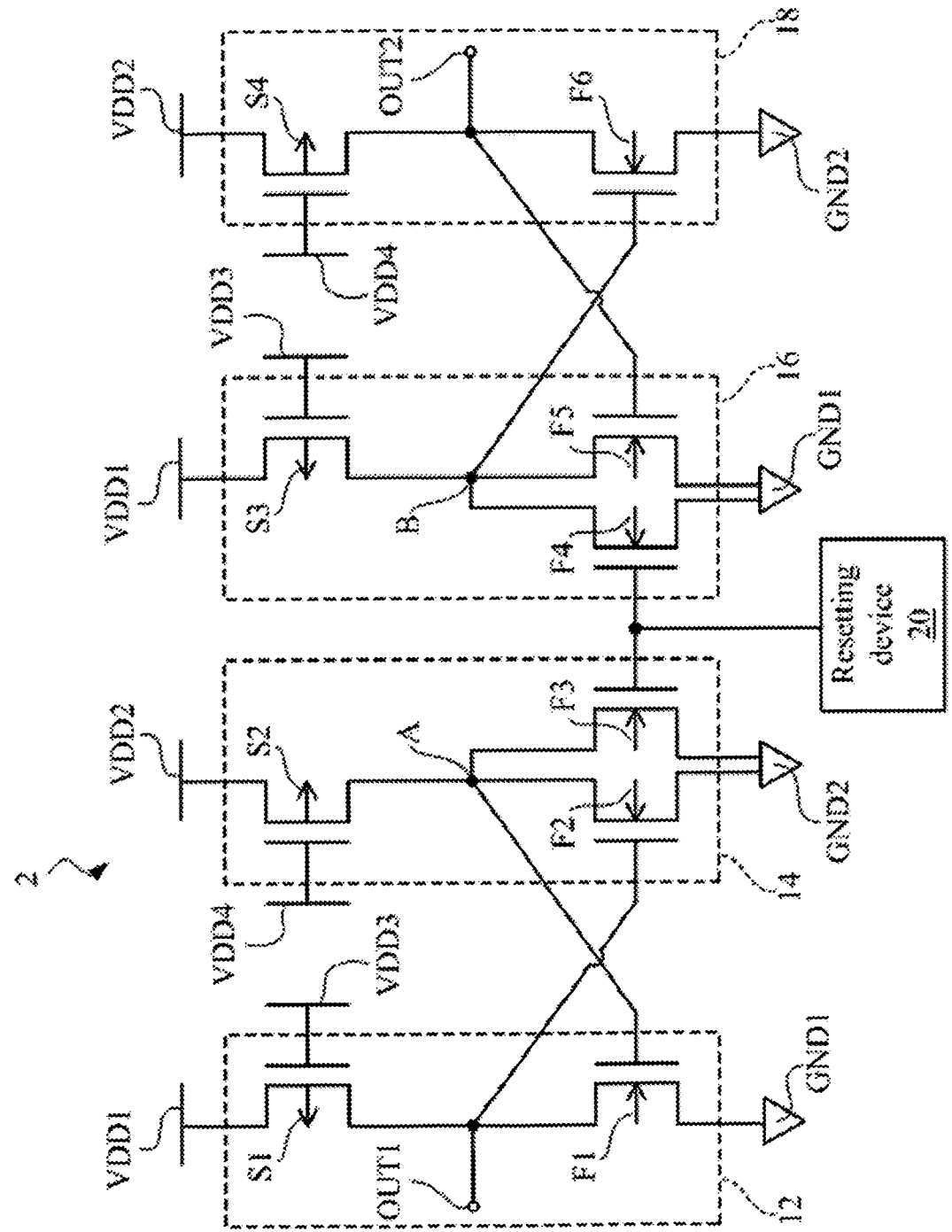
FIG. 2 is a schematic diagram showing a transient voltage detecting circuit of another embodiment according to the present invention.

In another embodiment, as shown in FIG. 2, the circuit structure and operating principle of a transient voltage detecting circuit 2 are similar to the above-mentioned transient voltage detecting circuit 1. The differences between the transient voltage detecting circuit 1 and the transient voltage detecting circuit 2 are that the first-type MOS transistors are N-type MOS transistors, and the second-type MOS transistors are P-type MOS transistors. Moreover, the position of the first power supply VDD1 and the position of the first ground GND1 are switched, and the position of the second power supply VDD2 and the position of the second ground GND2 are switched. At this time, the reset signal being outputted by the resetting device 20 is a Pull-up signal. In FIG. 2, the third power supply VDD3 can be replaced by another ground, and the fourth power supply VDD4 can be also replaced by another ground.

Apparently, the transient voltage detecting circuit basically employs a latch comparator as a detecting unit to effectively reduce the size of the detecting circuit for simultaneously monitoring a plurality of power supplies according to the present invention. The resetting device 20 that is needed by the first device 12 and the second device 14 and the resetting device 20 that is needed by the third device 16 and the fourth device 18 are the same component which effectively reduce the total size of the detecting circuit.

What needs to be mentioned is that once a transient voltage occurs, components of the transient voltage detecting circuit according to the present invention, comprising the resetting device, retain their original electric characteristics to detect the transient voltage quickly and precisely without citing or referencing the power supplies. Besides, if the size of the transient voltage detecting circuit of the present invention needs to be further reduced, it can be done through connecting a resistance with low impedance to each power supply in series, without utilizing the ESD rule.

The value of the impedance is about 25 to 100 ohm (Ω).

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A transient voltage detecting circuit for an electronic system having a first power supply, a second power supply, a third power supply, a fourth power supply, a fifth power supply, and a sixth power supply, said circuit comprising:

a first device comprising a first first-type MOS transistor, coupled to the first power supply, and a first second-type MOS transistor, coupled between the first first-type MOS transistor and the fifth power supply and also coupled via a gate thereof to the third power supply; the first device also providing a first output terminal between the first first-type MOS transistor and the first second-type MOS transistor;

a second device comprising a second first-type MOS transistor, coupled to the second power supply and coupled via a gate thereof to the first output terminal, a third first-type MOS transistor, coupled in parallel with the second first-type MOS transistor, and a second second-type MOS transistor, coupled between the second first-type MOS transistor and the sixth power supply and coupled via a gate thereof to the fourth power supply, the first first-type MOS transistor being coupled via a gate thereof to a first node formed between the second first-type MOS transistor and the second second-type MOS transistor; and a resetting device, having an output coupled to a gate of the third first-type MOS transistor, for outputting a reset signal to turn on the third first-type MOS transistor such that the voltage at the first node is at a first logic state and the voltages at the first output terminal is latched at a second logic state;

wherein once a negative transient voltage occurs at the third power supply, the voltage at the first node changes to the second logic state so that the voltage at the first output terminal changes to the first logic state;

wherein once a positive transient voltage occurs at the fourth power supply, the voltage at the first node changes to the second logic state so that the voltage at the first output terminal changes to the first logic state;

wherein once the positive transient voltage occurs at the first power supply, the first first-type MOS transistor is turned on so that the first output terminal changes to the first logic state; and wherein once the negative transient voltage occurs at the second power supply, the first first-type MOS transistor is turned on so that the first output terminal changes to the first logic state.

2. The circuit of claim 1, further comprising:

a third device comprising a fourth first-type MOS transistor, coupled to the first power supply, a fifth first-type MOS transistor, coupled in parallel with the fourth first-type MOS transistor, and a third second-type MOS transistor, coupled between the fourth first-type MOS transistor and the fifth power supply and coupled via a gate thereof to the third power supply; and a fourth device comprising a sixth first-type MOS transistor, coupled to the second power supply and coupled via a gate thereof to a second node formed between the fourth first-type MOS transistor and the third second-type MOS transistor, and a fourth second-type MOS transistor, coupled between the sixth first-type MOS transistor and the sixth power supply and coupled via a gate thereof to the fourth power supply; the fourth device also providing a second output terminal between the sixth first-type MOS transistor and the fourth second-type MOS transistor, the sixth first-type MOS transistor being coupled via a gate thereof to the second output terminal, wherein the resetting device is also via the output thereof coupled to a gate of the fifth first-type MOS transistor, and outputs the reset signal to turn on the fourth first-type MOS transistor such that the voltage at the second node is at the first logic state and the voltages at the second output terminal is latched at the second logic state;

wherein once the positive transient voltage occurs at the third power supply, the voltage at the second node changes to the second logic state so that the voltage at the second output terminal changes to the first logic state;

wherein once the negative transient voltage occurs at the fourth power supply, the voltage at the second node changes to the second logic state so that the voltage at the second output terminal changes to the first logic state;

wherein once the negative transient voltage occurs at the first power supply, the sixth first-type MOS transistor is turned on so that the voltage at the second output terminal changes to the first logic state; and wherein once the positive transient voltage occurs at the second power supply, the sixth first-type MOS transistor is turned on so that the voltage at the second output terminal changes to the first logic state.

3. The circuit of claim 2, wherein said electronic system works normally, the voltage of the first power supply is substantially equal to the voltage of the second power supply, the voltage of the third power supply is substantially equal to the voltage of the fourth power supply, and the voltage of the fifth power supply is substantially equal to the voltage of the sixth power supply.

4. The circuit of claim 3, wherein the reset signal is a pull-down signal, the first-type MOS transistors are P-type MOS transistors, the second-type MOS transistors are N-type MOS transistors, the first logic state is logic HIGH, the second logic state is logic LOW, and the fifth power supply and the sixth power supply are grounds, respectively.

5. The circuit of claim 3, wherein the reset signal is a pull-up signal, the first-type MOS transistors are N-type MOS transistors, the second-type MOS transistors are P-type MOS transistors, the firs logic state is logic LOW, the second logic state is logic HIGH, and the first power supply and the second power supply are grounds, respectively.

6. The circuit of claim 5, wherein the third power supply and the fourth power supply are grounds, respectively.

* * * * *